US012567857B2

(12) United States Patent
Aas et al.

(10) Patent No.: US 12,567,857 B2
(45) Date of Patent: Mar. 3, 2026

(54) DYNAMIC VOLTAGE AND FREQUENCY SCALING

(71) Applicant: Nordic Semiconductor ASA, Trondheim (NO)

(72) Inventors: Arne Aas, Trondheim (NO); Bjørnar Hernes, Trondheim (NO); Anders Vinje, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 1 day.

(21) Appl. No.: 18/735,036

(22) Filed: Jun. 5, 2024

(65) Prior Publication Data

US 2024/0413811 A1 Dec. 12, 2024

(30) Foreign Application Priority Data

Jun. 8, 2023 (GB) ..................................... 2308569

(51) Int. Cl.
| | |
|---|---|
| *H03K 3/01* | (2006.01) |
| *G06F 1/3296* | (2019.01) |
| *H03K 3/012* | (2006.01) |
| *H03K 19/00* | (2006.01) |

(52) U.S. Cl.
CPC ........... *H03K 3/012* (2013.01); *G06F 1/3296* (2013.01); *H03K 19/0016* (2013.01)

(58) Field of Classification Search
CPC ...... H03K 3/01; H03K 3/012; H03K 19/0008; H03K 19/0016; H03K 2217/0036; H03K 2217/94042; G06F 1/32; G06F 1/3203; G06F 1/3234; G06F 1/3237; G06F 1/324; G06F 1/3296
See application file for complete search history.

(56) References Cited

U.S. PATENT DOCUMENTS

| | | | |
|---|---|---|---|
| 7,782,125 B2 * | 8/2010 | Shimura ................ | H03K 3/012 |
| | | | 327/535 |
| 9,529,377 B2 | 12/2016 | Wang et al. | |
| 2017/0141766 A1 * | 5/2017 | Kao ................... | H03K 3/35625 |

OTHER PUBLICATIONS

Combined Search and Examination Report under Sections 17 and 18(3) for Great Britain Application No. GB2308569.9, 8 pages, Nov. 6, 2023.

* cited by examiner

*Primary Examiner* — Long Nguyen
(74) *Attorney, Agent, or Firm* — Klarquist Sparkman, LLP

(57) ABSTRACT

An integrated circuit comprises an oscillator which outputs a clock signal, a logic circuit portion, a detection circuit portion for detecting signal propagation delay relative to clock frequency, and a power supply which provides a configurable supply voltage. The detection circuit comprises a latch circuit portion, a delay circuit portion and a comparison circuit portion. The latch circuit portion outputs an alternating signal which changes state in dependence on the clock signal. This is received by the delay circuit portion which outputs first and second delayed signals respectively subject to first and second propagation delays each dependent on the supply voltage. The comparison circuit portion compares the alternating signal with the delayed signals, and outputs respective comparison signals if said signals indicate that the respective propagation delay is smaller than the clock signal period. A control circuit portion controls the supply voltage in dependence on the comparison signals.

20 Claims, 4 Drawing Sheets

1

DYNAMIC VOLTAGE AND FREQUENCY SCALING

CROSS REFERENCE TO RELATED APPLICATION

This application claims priority from Great Britain Application No. 2308569.9, filed Jun. 8, 2023, which application is incorporated herein by reference in its entirety.

TECHNICAL FIELD

The present invention relates to dynamic voltage and frequency scaling in integrated circuits.

BACKGROUND

Dynamic voltage and frequency scaling (DVFS) is a technique employed in modern integrated circuits in order to optimize resource allocation for tasks and reduce overall power consumption. DVFS typically involves controlling clock frequency and/or supply voltage depending on application—in particular reducing clock frequency and/or supply voltage to components when they are performing tasks which are e.g. not time-sensitive and/or have low levels of computational complexity. DVFS is of particular use in battery-powered devices where power consumption is of particular concern.

It is important for all electronic devices that supply voltage is sufficiently high, and/or that clock frequency is sufficiently low, that it can be guaranteed that logic signals are able to propagate through logic components and reach their intended destination within a single clock period. Problems can arise if signals are not able to do so. For example, branches of code can be skipped which can lead to application failures as well as security risks. This guarantee is of particular importance in DVFS implementations since supply voltage and/or clock frequency are configurable.

Prior DVFS approaches are typically implemented in software, and based on worst-case process and temperature corners for integrated circuit components in order to ensure safe operation across devices and conditions. As a result, such approaches are typically non-optimal as large safety margins for both supply voltage and clock frequency are required in order to guarantee such safe operation. As a result, while such approaches can reduce overall power consumption, there are still significant improvements to made.

The present invention aims to address at least some of the issues set out above.

SUMMARY OF THE INVENTION

When viewed from a first aspect, the present invention provides an integrated circuit comprising:

an oscillator arranged to output a periodic clock signal;
a logic circuit portion;
a detection circuit portion for detecting signal propagation delay relative to a frequency of said clock signal;
a configurable power supply arranged to provide a configurable supply voltage to the logic circuit portion and to the detection circuit portion;
wherein the detection circuit portion comprises:
a latch circuit portion arranged to output an alternating signal that changes state in dependence on the clock signal;

a delay circuit portion arranged to receive said alternating signal, output a first delayed signal subject to a first propagation delay which is dependent on the configurable supply voltage, and output a second delayed signal subject to a second propagation delay which is dependent on the configurable supply voltage; and
a comparison circuit portion arranged to:
compare the alternating signal and the first delayed signal, and output a first comparison signal if said signals indicate that the first propagation delay is smaller than a period of the clock signal; and
compare the alternating signal and the second delayed signal, and output a second comparison signal if said signals indicate that the second propagation delay is smaller than the period of the clock signal; and
a control circuit portion arranged to control the configurable supply voltage provided by the configurable power supply in dependence on the first and second comparison signals.

When viewed from a second aspect, the present invention provides a method of controlling a configurable supply voltage provided by a configurable power supply, the method comprising:

receiving a periodic clock signal;
generating an alternating signal that changes state once per clock cycle of the clock signal;
subjecting the alternating signal to a first propagation delay which is dependent on the configurable supply voltage in order to provide a first delayed signal;
subjecting the alternating signal to a second propagation delay which is dependent on the configurable supply voltage in order to provide a second delayed signal;
comparing the alternating signal and the first delayed signal and generating a first comparison signal if said signals indicate that the first propagation delay is smaller than the period of the clock signal;
comparing the alternating signal and the second delayed signal and generating a second comparison signal if said signals indicate that the second propagation delay is smaller than the period of the clock signal; and
controlling the configurable supply voltage provided by the configurable power supply in dependence on the first and second comparison signals.

Thus it will be seen by those skilled in the art that, since the first and second propagation delays are dependent on the configurable supply voltage, the present invention enables integrated circuit device-specific control of supply voltage based on signals indicative of actual propagation delays resulting from that supply voltage. This enables the supply voltage to be controlled, for a particular device and at particular conditions, to near-optimal values where safe operation of that device is ensured, but supply voltage and therefore overall power consumption is minimised. Unlike prior implementations, this control does not need to account for all potential process and temperature variations which can occur across integrated circuit devices, and thus can provide substantial improvements in power consumption and resource allocation, particularly for devices which are capable of operating at more efficient operating conditions than other devices of the same design due to process and/or temperature variations. The present invention is therefore particularly advantageous for battery-power devices, as these reductions in overall power consumption can improve battery life.

In a set of embodiments, the integrated circuit is configured for dynamic voltage and frequency scaling (DVFS). The integrated circuit may be part of a larger electronic device configured for DVFS.

The delayed signals may comprise delayed versions of the alternating signal. The comparison signals may each comprise a binary signal having a first state to indicate that the respective propagation delay is smaller than the period of the clock signal, and having a second state to indicate that the respective propagation delay is greater than or equal to the period of the clock signal. The delay circuit portion may be configured such that the first and second propagation delays are greater than an inherent propagation delay of a signal path in the logic circuit portion, which may be the critical path (i.e. the signal path in the logic circuit portion which introduces the longest inherent propagation delay to signals propagating therethrough). Thus, the two comparison signals may provide the control circuit portion with indicators of whether the supply voltage is sufficiently high relative to the clock frequency to ensure safe operation of the logic circuit portion.

In a set of embodiments, the delay circuit portion comprises a replica delay path comprising one or more logic elements each respectively type-matched to a logic element located in a signal path in the logic circuit portion, which may be the critical path. The first and second propagation delays may be dependent on a propagation delay introduced by the replica delay path. Thus, the inclusion of the replica delay path may enable the first and second propagation delays to closely track an inherent propagation delay of the signal/critical path in the logic circuit portion as the supply voltage changes, thus enabling more precise control of the supply voltage.

In a set of embodiments, the delay circuit portion comprises a first delay element and a second delay element connected in series, wherein an output of the first delay element provides the first delayed signal and an output of the second delay element provides the second delayed signal. In a set of such embodiments, the first and second delay elements are connected in series with the replica delay path.

Thus, the first and second propagation delays may each be made up of the delay of the replica delay path (which may track the inherent delay of the critical path), plus a respective additional delay margin. Thus it will be seen that the first and second propagation delays may both be larger than the inherent delay of the critical path, thus ensuring that both comparison signals indicate whether the supply voltage is sufficient relative to the clock frequency to guarantee safe operation of the logic circuit portion, albeit that the first propagation delay represents a smaller safety margin than the second propagation delay. This implementation may enable the detection circuit portion to require a minimum of components, thereby reducing a bill-of-materials, reducing chip area, and reducing overall power consumption.

In a set of embodiments, the control circuit portion is arranged to control the supply voltage so as to ensure that the first comparison signal indicates that the first propagation delay is smaller than the period of the clock signal, and the second comparison signal indicates that the second propagation delay is equal to or larger than the period of the clock signal. This may enable the supply voltage to be controlled to a near-optimal level by the control circuit portion—i.e. one in which the supply voltage is reduced to a level where a minimum margin over the critical path, as represented by the first propagation delay, is achieved, but the margin is lower than that represented by the second propagation delay.

In a set of embodiments, the control circuit portion is arranged to adjust the supply voltage provided by the configurable power supply in steps, and to wait for a predetermined period of time between each adjustment step that is sufficient for the supply voltage to settle following the previous adjustment step. This may enable precise control of the supply voltage while accounting for any fluctuations which may occur in the supply voltage following adjustments made thereto, thereby ensuring safe operation of the logic circuit portion is maintained at all times.

Each adjustment step may have a predetermined size. The control circuit portion may be arranged to decrease the supply voltage by a first step when both comparison signals indicate that the respective propagation delay is smaller than the period of the clock signal. The control circuit portion may be arranged to increase the supply voltage by a second step when both comparison signals indicate that the respective propagation delay is not smaller than the period of the clock signal (i.e. it is greater than or equal to the period of the clock signal). The first and second steps may preferably be of the same size, but they may instead be of different sizes. The control circuit portion may be arranged to maintain a current supply voltage when the first comparison signal indicates that the first propagation delay is smaller than the period of the clock signal, and the second comparison signal indicates that the second propagation delay is not smaller than the period of the clock signal (i.e. it is greater than or equal to the period of the clock signal).

In a set of embodiments, the control circuit portion is arranged to observe the comparison signals at a predetermined interval, and to determine whether to adjust the supply voltage based on said observation. This may enable the control circuit portion to continually maintain the supply voltage at near-optimal levels, particularly in the presence of temperature fluctuations. In a set of embodiments, the integrated circuit further comprises a temperature sensor, and the control circuit portion is arranged to observe the comparison signals in response to an output of the temperature sensor indicating that a change in temperature greater than a threshold temperature change has occurred. Similarly, this may enable the control circuit portion to continually maintain the supply voltage at near-optimal levels, particularly in the presence of temperature fluctuations. Observations could be based on either or both of these criteria.

In a set of embodiments, the oscillator is a configurable oscillator arranged to output a periodic clock signal having a configurable clock frequency. In a set of such embodiments, the control circuit portion is arranged to control the supply voltage to a level which is known to be safe for the desired clock frequency before the clock frequency is changed, and then control the supply voltage in dependence on the first and second comparison signals once the clock frequency has been changed. This may enable the control circuit portion to control the supply voltage quickly when the clock frequency is changed, and ensure that safe operation of the logic circuit portion is ensured at all times while the clock frequency is changed. In some embodiments, the control circuit portion is arranged to control the frequency of the clock signal in dependence on the first and second comparison signals.

In a set of embodiments:
the delay circuit portion is further arranged to output one or more additional delayed signals each subject to a respective propagation delay that is dependent on the configurable supply voltage;
for each of said one or more delayed signals, the comparison circuit portion is arranged to compare the alternating signal and the respective delayed signal, and output a respective comparison signal if said signals indicate that the respective propagation delay is smaller than the period of the clock signal; and the control circuit portion is further arranged to control the configurable supply voltage in dependence on each respective comparison signal. This may enable the control circuit portion to have better control of the supply voltage as it may be provided with at least some quantitative amount of information regarding how the propagation delays are affected by changes in the supply voltage such that the size of an adjustment to the configurable supply voltage can be selected as a result.

In a set of embodiments, the delay circuit portion comprises a plurality of delay elements connected in series, wherein each of the delayed signals is provided by an output of a respective delay element of the plurality of delay elements. For example, the delay circuit portion may comprise one or more additional delay elements connected in series with the first and second delay elements, with each of the one or more additional delayed signals being provided by an output of a respective delay element of the one or more additional delay elements. Such an arrangement may enable the alternating signal to be subjected to each of the propagation delays while using a minimum of components, thereby reducing a bill-of-materials, reducing chip area, and reducing overall power consumption.

In a set of such embodiments, the control circuit portion is arranged to generate, based on the comparison signals output by the comparison circuit portion, a difference value indicative of a difference between a current supply voltage and a desired supply voltage, and to control the configurable supply in dependence on said difference value. This enable more rapid control of the supply voltage by the control circuit portion. The difference value may be a unary- or thermometer-coded value comprising a plurality of bits each having a value that is dependent on a respective one of the comparison signals. The difference value may indicate the magnitude of deviation from the minimum delay.

In a set of embodiments, the control circuit portion is arranged to adjust the configurable supply voltage in steps, the size of each step being controlled in dependence on the difference value. The control circuit portion may be arranged to adjust the supply voltage in smaller steps when the difference value indicates that the supply voltage is close to the desired supply voltage, and to adjust the supply voltage in larger steps when the difference value indicates that the supply voltage is further away from the desired supply voltage. The control circuit portion may be arranged to control the supply voltage using 'P' (proportional), 'PI' (proportional integral) and/or 'PID' (proportional integral derivative) control based on the difference value observed over a period of time.

Each delay element may comprise a plurality of logic elements connected in series, each logic element introducing a propagation delay that is dependent on the supply voltage provided thereto. In a set of embodiments, each delay element comprises a plurality of inverters connected in series. Since the propagation delay introduced by an inverter is dependent on the supply voltage provided thereto, this may enable the propagation delay introduced by each delay element to be dependent on the configurable supply voltage. Each delay element may comprise an even number of inverters connected in series. This may enable the delayed signal at the output of each delay element to be non-inverted relative to the signal at its input, thereby enabling simpler comparison with the alternating signal output by the latch circuit portion.

In a set of embodiments, the comparison circuit portion comprises a first capture flip-flop which is clocked by the clock signal and arranged to receive the alternating signal at an input thereof, and, for each delayed signal output by the delay circuit portion:

a respective capture flip-flop clocked by the clock signal and arranged to receive the respective delayed signal at an input thereof; and a logic gate arranged to:

receive an output of the first capture flip-flop at a first input thereof;

receive an output of the respective flip-flop at a second input thereof; and output the respective comparison signal.

Such an arrangement may enable the states of the alternating signal and of each delayed signal to be captured each time the respective capture flip-flops are clocked (e.g. on a rising or falling edge of the clock signal). The first capture flip-flop, which receives the alternating signal as input without significant propagation delay, may sample the alternating signal with a time delay of one clock cycle. The other capture flip-flops, which each receive a respective delayed signal as input instead, may sample that respective delayed signal with a time delay of one clock cycle. Where the respective propagation delay that a respective delayed signal was subjected to is less than the clock period, the outputs of the first capture flip-flop and the respective capture flip-flop may be in the same state. If not, the outputs may be in different states. Thus, by comparing the output of the first capture flip-flop and each other capture flip-flop using the logic gate, the respective propagation delays may be compared to the clock signal period. Such an arrangement may provide cost-efficient, area-efficient and power-efficient circuitry for generating the comparison signals. Each logic gate may comprise an XNOR gate.

In a set of embodiments, the latch circuit portion is arranged to output an alternating signal which changes state once per clock cycle of the clock signal. The latch circuit portion may comprise a flip-flop which is clocked by the periodic clock signal and an inverter connected between an output of said flip-flop and an input of said flip-flop. Such an arrangement may provide cost-efficient, area-efficient and power-efficient circuitry for generating the alternating signal.

In a set of embodiments, the integrated circuit comprises one or more voltage domains having individual configurable supply voltages provided by the configurable power supply, each voltage domain comprising a respective detection circuit portion arranged to receive and control the respective supply voltage of that voltage domain. The power supply may comprise a plurality of respective voltage regulators for providing each respective supply voltage. Additionally or alternatively, each respective supply voltage may be provided by a respective configurable power supply. Such arrangements may enable the supply voltage to be individually controlled for each voltage domain, thereby allowing variations in supply voltage across the integrated circuit to be accounted for.

Features of any aspect or embodiment described herein may, wherever appropriate, be applied to any other aspect or embodiment described herein. In particular, while various embodiments have been described above in relation to the integrated circuit according to the integrated circuit according to first aspect, features of these embodiments may equally be applied to the method according to the second aspect. Where reference is made to different embodiments or set of embodiments, it should be understood that these are not necessarily distinct but may overlap.

BRIEF DESCRIPTION OF THE DRAWINGS

Embodiments of the invention will now be described, by way of example only, with reference to the accompanying drawings in which.

DETAILED DESCRIPTION OF THE DRAWINGS

Figure 1:
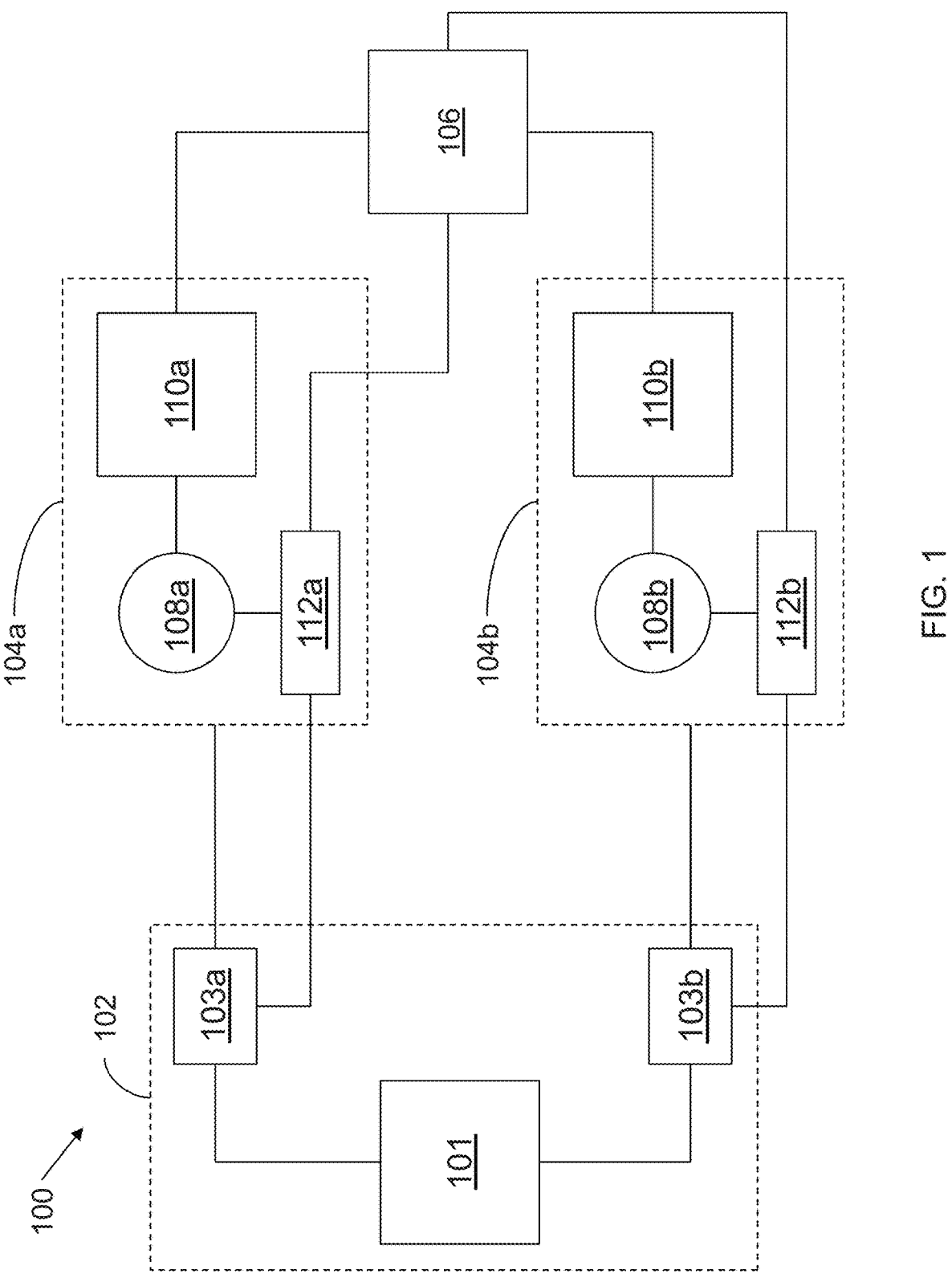
FIG. 1 is a schematic diagram illustrating an integrated circuit in accordance with an embodiment of the present invention.

FIG. 1 is a schematic diagram illustrating an integrated circuit 100 in accordance with an embodiment of the present invention. The integrated circuit 100 comprises a configurable power supply 102, a first voltage domain 104*a*, a second voltage domain 104*b*, and a memory 106. The power supply 102 comprises a power source 101 e.g. a battery, a first configurable voltage regulator 103*a*, and a second configurable voltage regulator 103*b*. The first voltage domain 104*a* comprises a first oscillator 108*a*, a first logic circuit portion 110*a*, and a first dynamic voltage frequency scaling (DVFS) control circuit portion 112*a*. Similarly, the second voltage domain 104*b* comprises a second oscillator 108*b*, a second logic circuit portion 110*b*, and a second DVFS control circuit portion 112*b*.

The power supply 102 provides a first supply voltage to the first voltage domain 104*a* via the first voltage regulator 103*a*, and provides a second supply voltage to the second voltage domain 104*b* via the second voltage regulator 103*b*. These supply voltages are supplied to all powered components within the respective voltage domain, including the oscillators 108*a-b*, logic circuit portions 110*a-b* and DVFS control circuit portions 112*a-b*. The first and second voltage regulators 103*a-b*, and thus the first and second supply voltages, are independently configurable. The first voltage regulator 103*a* and thus the first supply voltage it provides to the first voltage domain 104*a* is controlled, in part, by the first DVFS control circuit portion 112*a*. Similarly, the second voltage regulator 103*b* and thus the second supply voltage it provides to the second voltage domain 104*b* is controlled, in part, by the second DVFS control circuit portion 112*b*.

The oscillators 108*a-b* each output a periodic clock signal to the respective logic circuit portion 110*a-b* and to the respective DVFS control circuit portion 112*a-b*. In this embodiment, each oscillator 108*a-b* is a configurable oscillator arranged to output a periodic clock signal having a configurable frequency which is controlled by the logic circuit portion 110*a-b* in dependence on the operations being performed thereby. More generally, the clock frequency is application-specific and controlled using software. In particular, when the corresponding logic circuit portion 110*a-b* is performing non-time sensitive operations and/or operations which have relatively low levels of computational complexity, the frequency of the clock signal output by the respective oscillator 108*a-b* is reduced in order to reduce overall power consumption. Conversely, when time-sensitive operations and/or operations which have relatively high levels of computation complexity, the frequency of the clock signal is increased. Alternatively, the frequency of the clock signal output by the respective oscillator could be controlled by the DVFS control circuit portion e.g. using instructions stored in the memory.

While each voltage domain 104*a-b* is depicted as having its own respective oscillator 108*a-b* in FIG. 1, the integrated circuit 100 may equally comprise one or more oscillators which are shared by the different voltage domains 104*a-b*.

The logic circuit portions 110*a-b* are each coupled to the memory 106 and perform one or more operations based on instructions stored therein. The logic circuit portions 110*a-b* may comprise any suitable circuitry for this purpose, e.g. CPUs, as is well-known to those skilled in the art. Each logic circuit portion 110*a-b* comprises a so-called "critical path" which corresponds to the signal path through various logic elements in the logic circuit portion 110*a-b* which introduces the largest propagation delay to that signal. The critical path through the logic circuit portion 110*a-b* provides a worst-case timing scenario-if a signal is able to propagate through the critical path in a given period of time, it can be assumed to be able to propagate through all other signal paths in the logic circuit portion 110*a-b* in a smaller or equal time period. The critical path could at any given time instance be one of multiple different possible signal paths in the corresponding logic circuit portion 110*a-b*, depending on conditions. However the detection circuit portion, described later with reference to FIGS. 2-4, may be designed or selected to accommodate this.

The memory 106 may comprise any suitable volatile or non-volatile storage medium as is well-known by persons skilled in the art. While a single memory 106 is depicted in FIG. 1, the integrated circuit 100 may comprise any suitable number of memories e.g. a dedicated memory for each logic circuit portion 110*a-b* and/or each DVFS control circuit portion 112*a-b*.

Each DVFS control circuit portion 112*a-b* in this embodiment comprises dedicated logic circuitry hardcoded to control the operation of the respective voltage regulators 103*a-b* in the power supply 102. This may help reduce overall power consumption. In other embodiments, however, the DVFS control circuit portions 112*a-b* perform this control based on software instructions stored in the memory 106.

Each DVFS control circuit portion 112*a-b* comprises a detection circuit portion for detecting signal propagation delay relative to clock frequency which the DVFS control circuit portion 112*a-b* uses in controlling the supply voltage supplied to the respective voltage domain 104*a-b* by the respective voltage regulator 103*a-b* within the power supply 102. The detection circuit portion is described in more detail below with reference to FIGS. 2 to 5.

The example integrated circuit 100 shown in FIG. 1 is depicted as having two voltage domains 104*a-b*. However, it will be appreciated by those skilled in the art that the integrated circuit 100 could equally comprise any number of voltage domains 104, e.g. one, two, or more.

Figure 2:
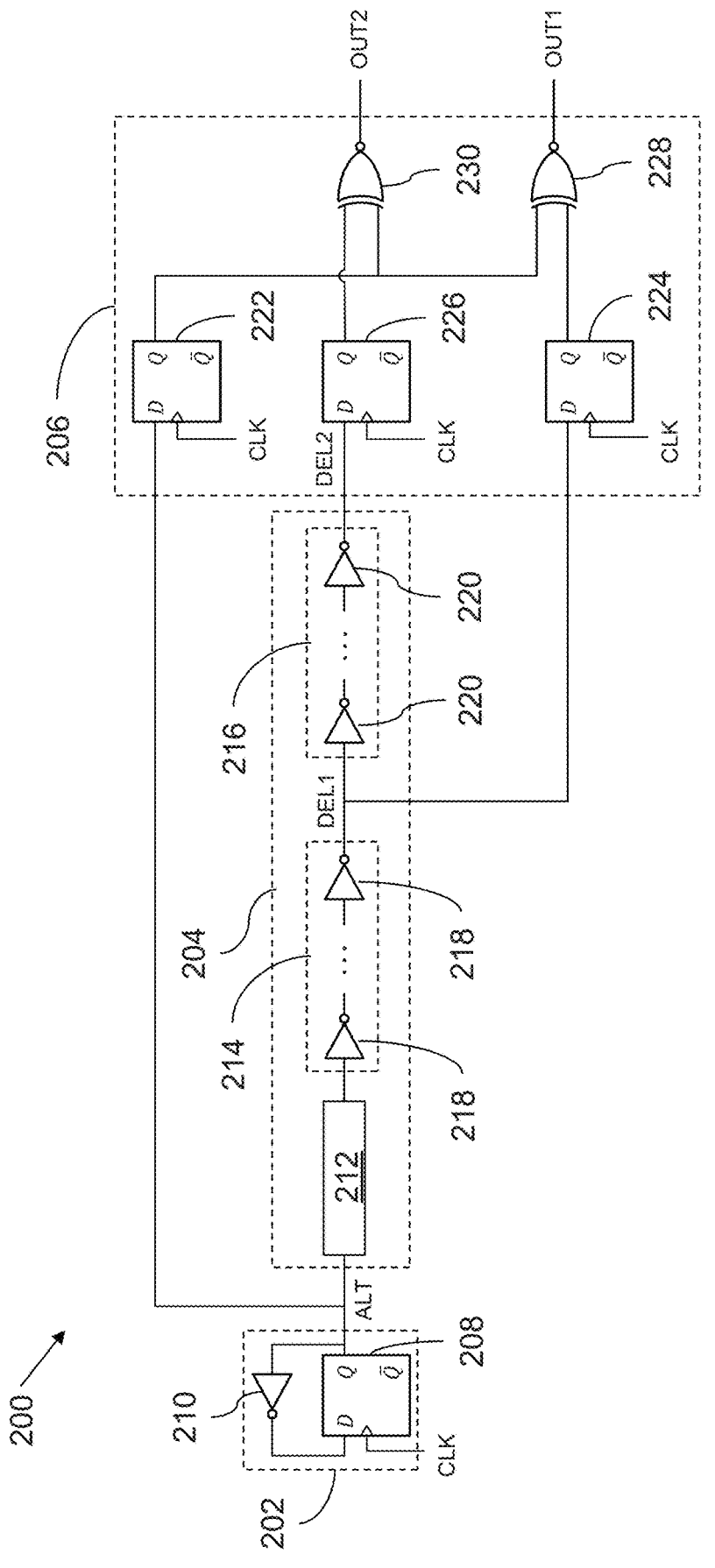
FIG. 2 is a schematic circuit diagram illustrating a detection circuit portion for use in integrated circuits in accordance with the present invention.

FIG. 2 is a schematic diagram illustrating a first detection circuit portion 200 for detecting signal propagation delay relative to clock frequency, suitable for inclusion in the DVFS control circuit portions 112*a-b* shown in FIG. 1. The first detection circuit portion 200 comprises a latch circuit portion 202, a delay circuit portion 204, and a comparison circuit portion 206.

The latch circuit portion 202 comprises a latch flip-flop 208 and an inverter 210. The clock input of the latch flip-flop 208 receives the clock signal CLK from the respective oscillator 108a-b shown in FIG. 1. The inverter 210 is connected between the input and the output of the latch flip-flop 208. This configuration provides a feedback loop which causes the latch flip-flop 208, and therefore the latch circuit portion 202, to output an alternating digital signal ALT which changes state each time the latch flip-flop 208 is clocked—e.g. on each rising edge of the clock signal CLK—i.e. once per clock cycle.

In order to reduce overall power consumption, the latch circuit portion 202 is enabled/disabled using other circuitry (e.g. clock gating or a control signal) in the respective DVFS control circuit portion 112a-b (not shown), depending on whether the detection circuit portion 200 is required—e.g. depending on whether frequency scaling is enabled/disabled.

The output of the latch circuit portion 202 is coupled to the input of the delay circuit portion 204. The delay circuit portion 204 comprises a replica delay path 212, a first delay element 214 and a second delay element 216, connected in series. In this embodiment, the replica delay path 212 comprises a string of logic elements which are each type-matched to logic elements (e.g. AND gates, NAND gates, OR gates, XOR gates, etc.) contained in the critical path of the corresponding logic circuit portion 110a-b. The replica delay path 212 therefore introduces a propagation delay to the signal received from the latch circuit portion 202 which replicates the inherent propagation delay of signals propagating through the critical path in the corresponding logic circuit portion 110a-b. This propagation delay is dependent on the supply voltage provided to the first detection circuit portion 200, since the propagation delay introduced by a given logic element to a signal is dependent on the supply voltage provided thereto, as is well-known in the art. In particular, as supply voltage decreases, the propagation delay introduced by a given logic element increases.

Where there are multiple possible critical paths in the corresponding logic circuit portion 110a-b, there may be multiple replica paths with corresponding control circuitry for selecting which one is used at a given time. Additionally, the replica delay 212 may not be an exact replica of the critical path (i.e. contain type-matched logic elements), but instead be a different path made of different logic elements which as a whole gives a propagation delay that matches or slightly exceeds that of the critical path.

While in this embodiment the replica circuit portion 212 is a replica of the critical path, it will be appreciated that the principles outlined herein apply equally where the replica delay path 212 contains logic elements type-matched to other signal paths in the corresponding logic circuit portion 110a-b.

The output of the replica delay path 212 is received at the input of the first delay element 214. The first delay element 214 comprises an even number of inverters 218 connected in series, the actual number of which may be selected dependent on implementation. The first delay element 214 therefore introduces a further propagation delay to the signal output by the latch circuit portion 202 which is dependent on the supply voltage provided to the first detection circuit portion 200.

The signal output by the first delay element 214 is therefore a delayed version of the alternating signal ALT output by the latch circuit portion 202 subject to a first propagation delay equal to the sum of the propagation delays introduced by the replica delay path 212 and the first delay element 214. This signal is referred to herein as the first delayed signal DEL1. Since the replica delay path 212 introduces a propagation delay which imitates the inherent delay of the critical path in the corresponding logic circuit portion 110a-b, the first propagation delay is substantially equal to the inherent propagation delay of the critical path, plus a first delay margin which is dependent on the propagation delay introduced by the first delay element 214.

The output of the first delay element 214 is received at the input of the second delay element 216. The second delay element 216 then introduces a further propagation delay to the signal output by the latch circuit portion 202 which is dependent on the supply voltage provided to the first detection circuit portion 200. The second delay element 216 has a similar structure to the first delay element 214 and comprises an even number of inverters 220 connected in series, the actual number of which may be selected dependent on implementation. The signal at the output of the second delay element 216 is therefore a delayed version of the alternating signal ALT output by the latch circuit portion 202, subject to a second propagation delay equal to the sum of the propagation delays introduced by the replica delay path 212, the first delay element 214 and the second delay element 216. The signal output by the second delay element 216 is referred to herein as the second delayed signal DEL2. The second propagation delay is substantially equal to the inherent propagation delay of the critical path, plus a second delay margin which is dependent on the propagation delays introduced by the first and second delay elements 214, 216.

The number of inverters 218, 220 included in the first and second delay elements 214, 216 may be any number, dependent on the desired delay margins for the first and second delayed signals. In this embodiment an even number of inverters 218, 220 are provided in the first and second delay elements 214, 216 in order to ensure that the delayed signals output thereby are non-inverted relative to the alternating signal ALT output by the latch circuit portion. This need not be the case, however, e.g. where the signal output by the replica delay path 212 is inverted relative to the alternating signal ALT output by the latch circuit portion 202. Additionally, while in this embodiment the delay elements 214, 216 comprise inverters 218, 220, these could equally comprise other types of components which introduce propagation delays that are dependent on supply voltage, e.g. logic functions like NAND gates or NOR gates where one input forms part of the overall signal delay path and the other is tied to a fixed signal as appropriate.

The comparison circuit portion 206 comprises a latch capture flip-flop 222, a first delay capture flip-flop 224 and a second delay capture flip-flop 226. The clock inputs of the three capture flip-flops 222, 224, 226 each receive the clock signal CLK from the respective oscillator 108a-b shown in FIG. 1. The latch capture flip-flop 222 receives the alternating signal ALT output by the latch circuit portion 202 at its input, and outputs a signal which captures the state of the alternating signal ALT when it is clocked—e.g. on a rising clock edge. Similarly, the first delay capture flip-flop 224 receives the first delayed signal DEL1 output by the first delay element 214 at its input, and outputs a signal which captures the state of the first delayed signal DEL1 when it is clocked—e.g. on a rising clock edge. The second delay capture flip-flop 226 receives the second delayed signal DEL2 output by the second delay element 216 at its input, and outputs a signal which captures the state of the second delayed signal DEL2 when it is clocked—e.g. on a rising clock edge.

The comparison circuit portion 206 also comprises a first XNOR gate 228 and a second XNOR gate 230. The first XNOR gate 228 receives the output of the latch capture flip-flop 222 at one of its inputs and the output of the first delay capture flip-flop 224 at the other of its inputs. The first XNOR gate 228 therefore outputs a first comparison signal OUT1 which indicates whether the outputs of the latch capture flip-flop 222 and the first delay capture flip-flop 224 are in the same state. In particular, the first XNOR gate 228 outputs a logic '1' when the outputs of the latch capture flip-flop 222 and the first delay capture flip-flop 224 are in the same state, and outputs a logic '0' when the flip-flop outputs are in different states. When these flip-flop outputs are in the same state, this indicates that a single period of the clock signal CLK provided sufficient time for the alternating signal ALT to propagate through the replica delay path 212 and the first delay element 214, and reach the first delay capture flip-flop 224 as the first delayed signal DEL1. Conversely, when these flip-flop outputs are in different states, this indicates that a single period of the clock signal CLK did not provide sufficient time for this propagation. Thus, the first comparison signal OUT1 indicates whether the first propagation delay is smaller than the period of the clock signal CLK.

The second XNOR gate 230 receives the output of the latch capture flip-flop 222 at one of its inputs, and receives the output of the second delay capture flip-flop 226 at the other of its inputs. The second XNOR gate 230 functions in much the same manner as the first XNOR gate 228, and thus outputs a second comparison signal OUT2 which indicates whether the second propagation delay is smaller than the period of the clock signal CLK.

The first and second comparison signals OUT1, OUT2 are used by control circuitry in the corresponding DVFS control circuit portion 112a-b (not shown in FIG. 2) to control the supply voltage output by the respective voltage regulator 103a-b within the power supply 102 to the respective voltage domain 104a-b. Since the first propagation delay is substantially equal to the inherent delay of the critical path, plus a first delay margin chosen to provide a minimum safe margin, if the first comparison signal OUT1 indicates that the first propagation delay 228 is smaller than the period of the clock signal CLK, this indicates that the supply voltage is high enough for safe operation of the corresponding logic circuit portion 110a-b without risk of glitches or incorrect logic operations occurring as a result of signals not being able to propagate through the logic circuit portion 110a-b in the period of a clock signal. The first delay circuit portion 214 provides a margin of error to this indication to account for process, voltage and/or temperature variations between the replica delay path 212 and the actually critical path in the corresponding logic circuit portion 110a-b.

Similarly, if the second comparison signal OUT2 indicates that the second propagation delay 230 is smaller than the period of the clock signal CLK, this also indicates that the supply voltage is high enough for safe operation of the corresponding logic circuit portion 110a-b. However, this also indicates that there is an overly large supply voltage margin being provided to the corresponding voltage domain 104a-b for this purpose since the second propagation delay is set to indicate this, so the supply voltage can be reduced while still maintaining safe operation of the corresponding logic circuit portion 110a-b.

Control circuitry in the corresponding DVFS control circuit portion 112a-b (not shown in FIG. 2) receives the first and second comparison signals OUT1, OUT2 and, in dependence thereon, controls the supply voltage output by the respective voltage regulator 103a-b within the power supply 102 to the respective voltage domain 104a-b. In particular, the control circuitry adjusts the supply voltage until the first comparison signal OUT1 indicates that that first propagation delay is smaller than the period of the clock signal CLK, and the second comparison signal OUT2 indicates that the second propagation delay is greater than or equal to the period of the clock signal CLK. This provides a particularly useful operating voltage, where safe operation of the corresponding logic circuit portion 110a-b is ensured, but the supply voltage is kept small thereby reducing overall power consumption. This is particularly advantageous in battery-powered devices where power consumption is of particular concern.

Control of the supply voltage output by the respective voltage regulator 103a-b within the power supply 102 to a voltage domain 104a-b by the respective DVFS control circuit portion 108a-b will now described in more detail with reference to FIG. 3.

Figure 3:
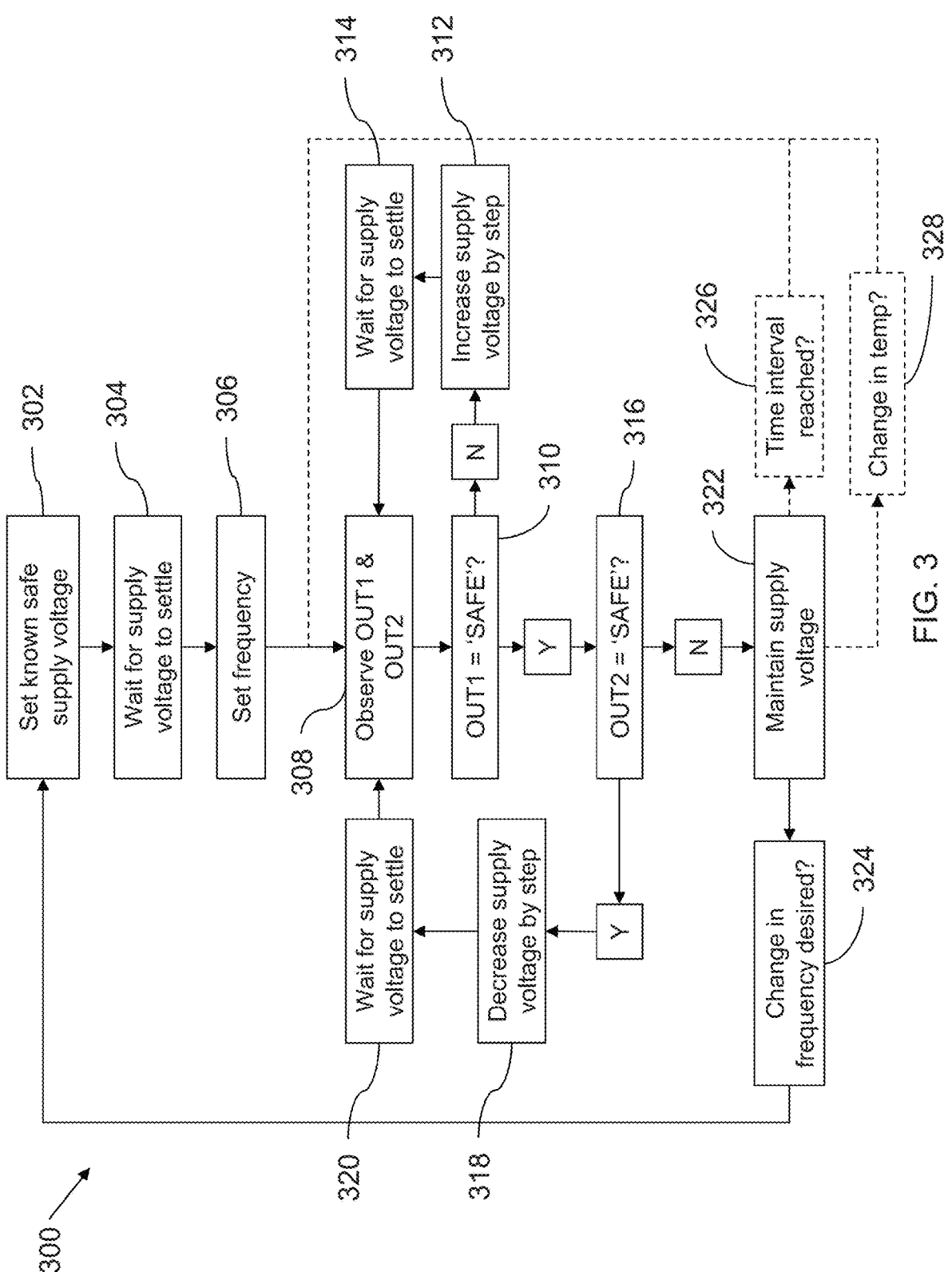
FIG. 3 is a flowchart illustrating a supply voltage tuning method in accordance with an embodiment of the present invention.

FIG. 3 is a flowchart 300 illustrating a supply voltage tuning algorithm, performed by the DVFS control circuit portions 112a-b shown in FIG. 1 using the first detection circuit portion 200 shown in FIG. 2, in accordance with an embodiment of the invention. At step 302, the DVFS control circuit portion 112a-b sets a known safe supply voltage. This may be a known safe supply voltage for all possible clock frequencies, or it may be set based on stored values in the memory 106 in dependence on the desired clock frequency, e.g. using a lookup table. At step 304, the DVFS control circuit portion 112a-b waits for the supply voltage to settle. This may involve the DVFS control circuit portion 112a-b waiting for a predetermined period of time sufficient to allow the supply voltage to settle, or by measuring the supply voltage and observing when it has sufficiently settled.

After the supply voltage has settled, at step 306, the DVFS control circuit portion 112a-b sets the frequency of the clock signal CLK output by the corresponding oscillator 108a-b to a desired value. In this embodiment, the desired clock frequency is typically set by instructions stored in the memory 106 based on the operations being performed by the corresponding logic circuit portion 110a-b—i.e. it is application-specific. It may, however, be controlled based on the comparison signals OUT1 and OUT2 in other embodiments.

At step 308, the DVFS control circuit portion 112a-b observes the comparison signals OUT1 and OUT2 output by the first detection circuit portion 200. At step 310, the DVFS control circuit portion 112a-b determines whether the first comparison signal OUT1 is 'SAFE'—i.e. indicating that the first propagation delay is smaller than the period of the clock signal as explained previously, which in this case is indicated by a logic '1'. If not, the DVFS control circuit portion 112a-b proceeds to step 312 where it increases the supply voltage to the corresponding voltage domain 104a-b by a step. In this embodiment, the size of the step is predetermined and hardcoded. It may in other embodiments be predetermined and configured by software stored in the memory 106, or it may be configurable e.g. using software stored in the memory 106. At step 314, the DVFS control circuit portion 112a-b waits for the supply voltage to settle in the same manner as at step 304. The DVFS control circuit portion 112a-b then returns to step 308 where it observes the comparison signals OUT1 and OUT2.

If at step 310 the DVFS control circuit portion 112a-b determines that the first comparison signal OUT1 is 'SAFE', then it proceeds to step 316 where it determines whether the second comparison signal OUT2 is 'SAFE'—i.e. indicating that the second propagation delay is smaller than the period of the clock signal as explained previously. If so, the DVFS control circuit portion 112a-b proceeds to step 318 where it decreases the supply voltage to the corresponding voltage domain 104a-b by a step. In this embodiment, the size of the step is predetermined and configured by software stored in the memory 106 or hardcoded, though it may in other embodiments be configurable e.g. in software. At step 320, the DVFS control circuit portion 112a-b waits for the supply voltage to settle in the same manner as at steps 304 and 314. The DVFS control circuit portion 112a-b then returns to step 308 where it observes the comparison signals OUT1 and OUT2.

If at step 316 the DVFS control circuit portion 112a-b determines that the second comparison signal is not 'SAFE', it proceeds to step 322 where it maintains the supply voltage to the corresponding voltage domain 104a-b at its current level. Having reached step 322, the DVFS control circuit portion 112a-b has determined that the supply voltage is at a particularly useful level where safe operation of the corresponding logic circuit portion 110a-b is ensured, but overall power consumption is reduced, and thus the supply voltage is maintained.

At step 324, if a change in clock frequency is desired e.g. as a result of software instructions stored in the memory 106, the DVFS control circuit portion 112a-b proceeds back to step 302, where it sets a known safe supply voltage as described previously, and repeats the whole process. By returning to the known, safe supply voltage, transient problems arising from the change in frequency may be avoided.

Propagation delay is not only dependent on supply voltage, but also on temperature and/or aging. In order to handle this, two optional steps 326 and 328 may also be included in the algorithm. One or both of steps 326 and 328 may be included, dependent on configuration. At optional step 326, the DVFS control circuit portion 112a-b determines whether a predetermined time interval, configured by software stored in the memory 106 or hardcoded, has been reached since the last observation of the comparison signals OUT1, OUT2 at step 308. The duration of each time interval may be fixed, or it may be configurable according to the expected temperature variation over time. When the time interval has been reached, the DVFS control circuit portion 112a-b proceeds back to step 308 where it observes the comparison signals OUT1, OUT2 again and repeats the tuning algorithm. This enables the DVFS control circuit portion 112a-b to continually configure the supply voltage in order to account for temperature variations.

At optional step 328, the DVFS control circuit portion 112a-b receives a signal from a temperature sensor (not shown in the figures) indicating that a change in temperature larger than a predetermined threshold has occurred. In response, the DVFS control circuit portion 112a-b proceeds back to step 308 where it observes the comparison signals OUT1, OUT2 again and repeats the tuning algorithm. This also enables the DVFS control circuit portion 112a-b to continually configure the supply voltage in order to account for temperature variations.

It will be appreciated by those skilled in the art that the flowchart 300 illustrates one possible technique for tuning supply voltage based on the comparison signals OUT1, OUT2 output by the control circuit portion, and that many other suitable methods could be performed with a similar overall outcome.

Figure 4:
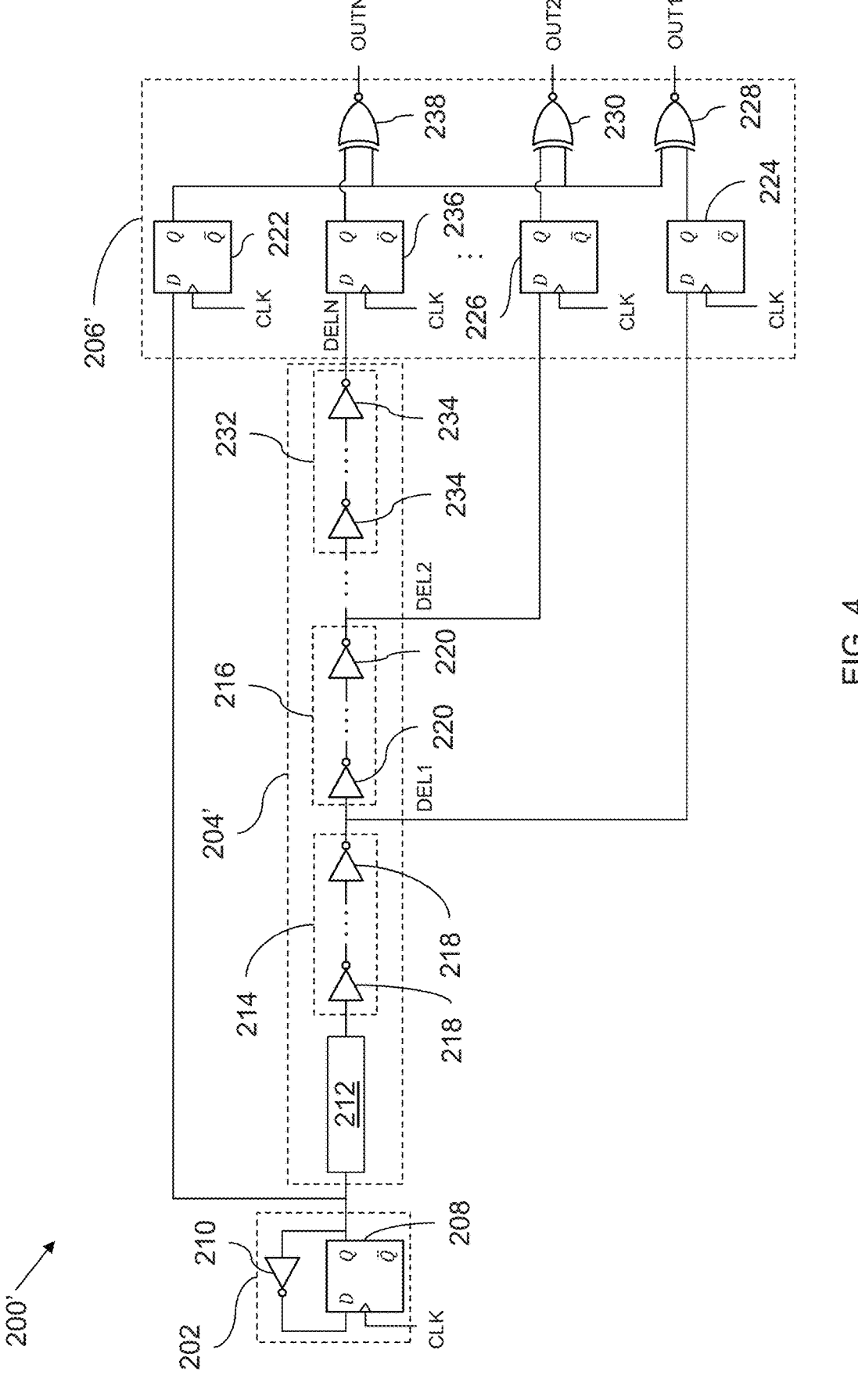
FIG. 4 is a schematic circuit diagram illustrating a more sophisticated detection circuit portion for use in integrated circuits in accordance with the present invention.

FIG. 4 is a schematic diagram illustrating a second detection circuit portion 200' for detecting signal propagation delay relative to clock frequency, suitable for inclusion in the DVFS control circuit portions 112a-b shown in FIG. 1, according to another embodiment. The second detection circuit portion 200' operates using the same principles as the first detection circuit portion 200 shown in FIG. 2, and shares many of the same components, but has a slightly more sophisticated structure to enable more rapid control of supply voltage by the DVFS control circuit portions 112a-b.

The second detection circuit portion 200' is largely similar to the first detection circuit portion 200 shown in FIG. 2, but with additional elements included in the delay circuit portion 204' and the comparison circuit portion 206'. In particular, the delay circuit portion 204' further comprises one or more additional delay elements coupled to the output of the second delay element 216, including an Nth delay element 232 which forms the final delay element. Any appropriate number of additional delay elements may be included in the delay circuit portion 204', but for the sake of simplicity only the Nth delay element 232 is discussed here. It will be appreciated that the operation of the Nth delay element 232 also equally applies to each other additional delay element included in the delay circuit portion 204' which is not shown in FIG. 4.

The Nth delay element comprises an even number of inverters 234 connected in series, and therefore introduces a propagation delay to the signal it receives in the same manner as the first and second delay elements 214, 216 as described previously with reference to FIG. 2. It may include any appropriate number of inverters 234, or other types of components which introduce propagation delays that are dependent on supply voltage in other embodiments, as described previously. Conveniently each of the delay elements 214, 216 . . . 232 could have an equal number of inverters 218, 220 . . . 234 such that they each introduce the same propagation delay, resulting in the comparison signals OUT1, OUT2 . . . . OUTN effectively forming a thermometer- or unary-coded value indicating the magnitude of deviation from the minimum delay. However, in other embodiments each of the delay elements 214, 216 . . . 232 could have different numbers of inverters 218, 220, . . . 234, and therefore introduce different respective propagation delays, dependent on implementation. The signal output by the Nth delay element 232 is therefore a delayed version of the alternating signal output by the latch circuit portion 202 subjected to an Nth propagation delay equal to the sum of the propagation delays introduced by the replica delay path 212, the first delay element 214, the second delay element 216, the Nth delay element 232, and each other delay element included in the delay circuit portion 204' but not shown in FIG. 4.

The comparison circuit portion 206' comprises an additional delay capture flip-flop, and an additional XNOR gate, for each additional delay element included in the delay circuit portion 204'. Since only the Nth delay element 232 is shown in FIG. 4 for simplicity, only the Nth delay capture flip-flop 236 and the Nth XNOR gate 238 is shown in FIG. 4. Only the operation of the Nth delay capture flip-flop and Nth XNOR gate 238 is described here for the sake of brevity, though the skilled person will appreciate that this applies equally for each other delay element, delay capture flip-flop and XNOR gate included in the detection circuit portion 200' but not shown in FIG. 4.

The Nth delay capture flip-flop 236 receives the clock signal CLK from the respective oscillator 108*a-b* shown in FIG. 1, and receives the Nth delayed signal DELN from the output of the Nth delay element 232 at its input. It therefore outputs a signal which captures the state of the Nth delayed signal DELN when it is clocked, in the same manner as the first and second delay capture elements 224, 226 described previously with reference to FIG. 2.

The Nth XNOR gate 238 receives the output of the latch capture flip-flop 222 at one of its inputs and that output of the Nth delay capture flip-flop 236 at the other of its inputs. The Nth XNOR gate 238 functions in much the same manner as the first and second XNOR gates 228, 230, and thus outputs an Nth comparison signal OUTN which indicates whether the Nth propagation delay is smaller than the period of the clock signal CLK.

The comparison signals OUT1, OUT2 . . . OUTN are used by the DVFS control circuitry 112*a-b* to generate a difference value. As described above the difference value could be a binary number where each bit corresponds to the state of a respective comparison signal OUT1, OUT2 . . . OUTN— i.e. where the first comparison signal is a logic '1', the first bit of the difference value is a logic '1', etc. This difference value is therefore indicative of the difference between the current supply voltage and a desired supply voltage—the desired supply voltage in this embodiment being that which causes the comparison signal OUT1 to indicate that the first propagation delay is smaller than the clock signal period, and the remaining comparison signals OUT2 . . . OUTN are greater than or equal to the clock signal period. This difference value is then used by the DVFS control circuit portion 112*a-b* to control the supply voltage provided by the corresponding voltage regulator 103*a-b* within the power supply 102 to the corresponding voltage domain 104*a-b*.

There are numerous ways in which this can be done depending on the number of additional delay elements. In one embodiment, the DVFS control circuit portion 112*a-b* performs a similar step-wise algorithm to that shown in FIG. 3, except the size of the steps with which the supply voltage is decreased (and, optionally, the steps with which it is increased) are dependent on the difference value. When the difference value is large, i.e. indicating that the supply voltage is significantly larger than the preferred value, the supply voltage is decreased by a larger step than when the difference value is small, i.e. indicating that the supply voltage is close to the preferred value. This advantageously enables the supply voltage to reach the desired value more rapidly, thereby reducing overall power consumption.

In another embodiment, the DVFS control circuit portion 112*a-b* calculates the rate of change of the difference value over time based on multiple observations thereof. This enables the DVFS control circuit portion 112*a-b* to predict changes in e.g. power draw from the power supply 102, which may cause a drop in supply voltage, and adjust the supply voltage accordingly to account for these. For example, if the draw on the power supply increases rapidly, the supply voltage may drop rapidly. The DVFS control circuit portion 112*a-b* can detect this quickly by calculating the rate of change of the difference value, and respond accordingly by raising the supply voltage before it drops too low to enable safe operation of the corresponding logic circuit portion 110*a-b*.

In other embodiments, the DVFS control circuit portion 112*a-b* uses the difference value to perform, over time, 'P' (proportional), 'PI' (proportional integral) and/or 'PID' (pro-portional integral derivative) control of the supply voltage. Such control processes are known in the art and therefore not discussed in detail here.

The invention claimed is:

1. An integrated circuit comprising:
an oscillator arranged to output a periodic clock signal;
a logic circuit portion;
a detection circuit portion for detecting signal propagation delay relative to a frequency of said clock signal;
a configurable power supply arranged to provide a configurable supply voltage to the logic circuit portion and to the detection circuit portion;
wherein the detection circuit portion comprises:
a latch circuit portion arranged to output an alternating signal that changes state in dependence on the clock signal;
a delay circuit portion arranged to receive said alternating signal, output a first delayed signal subject to a first propagation delay which is dependent on the configurable supply voltage, and output a second delayed signal subject to a second propagation delay which is dependent on the configurable supply voltage; and
a comparison circuit portion arranged to:
compare the alternating signal and the first delayed signal, and output a first comparison signal if the alternating signal and the first delayed signal indicate that the first propagation delay is smaller than a period of the clock signal; and
compare the alternating signal and the second delayed signal, and output a second comparison signal if the alternating signal and the second delayed signal indicate that the second propagation delay is smaller than the period of the clock signal; and
a control circuit portion arranged to control the configurable supply voltage provided by the configurable power supply in dependence on the first and second comparison signals;
wherein the delay circuit portion comprises a first delay element and a second delay element connected in series, wherein an output of the first delay element provides the first delayed signal and an output of the second delay element provides the second delayed signal.

2. The integrated circuit as claimed in claim 1, wherein the comparison signals each comprises a binary signal having a first state to indicate that the respective propagation delay is smaller than the period of the clock signal, and having a second state to indicate that the respective propagation delay is greater than or equal to the period of the clock signal.

3. The integrated circuit as claimed in claim 1, wherein the delay circuit portion is configured such that the first and second propagation delays are greater than an inherent propagation delay of a critical path in the logic circuit portion.

4. The integrated circuit as claimed in claim 1, wherein the delay circuit portion comprises a replica delay path comprising one or more logic elements each respectively type-matched to a logic element located in a critical path in the logic circuit portion, the replica delay path being connected in series with the first and second delay elements.

5. The integrated circuit as claimed in claim 1, wherein the control circuit portion is arranged to control the configurable supply voltage so as to ensure that the first comparison signal indicates that the first propagation delay is smaller than the period of the clock signal, and the second comparison signal indicates that the second propagation delay is equal to or larger than the period of the clock signal.

6. The integrated circuit as claimed in claim 1, wherein the control circuit portion is arranged to adjust the configurable supply voltage provided by the configurable power supply in steps, and to wait for a predetermined period of time between each adjustment step that is sufficient for the configurable supply voltage to settle following the previous adjustment step.

7. The integrated circuit as claimed in claim 1, wherein the control circuit portion is arranged to:

decrease the configurable supply voltage by a first step when the first and second comparison signals indicate that the respective propagation delay is smaller than the period of the clock signal;

increase the configurable supply voltage by a second step when the first and second comparison signals indicate that the respective propagation delay is not smaller than the period of the clock signal; and maintain a current supply voltage when the first comparison signal indicates that the first propagation delay is smaller than the period of the clock signal, and the second comparison signal indicates that the second propagation delay is not smaller than the period of the clock signal.

8. The integrated circuit as claimed in claim 1, wherein the control circuit portion is arranged to observe the comparison signals at a predetermined interval, and to determine whether to adjust the configurable supply voltage based on said observation.

9. The integrated circuit as claimed in claim 1, wherein:

the oscillator is a configurable oscillator arranged to output the periodic clock signal with a configurable clock frequency; and the control circuit portion is arranged to control the configurable supply voltage to a level which is known to be safe for a desired clock frequency before the configurable clock frequency is changed, and then control the configurable supply voltage in dependence on the first and second comparison signals once the clock frequency has been changed.

10. The integrated circuit as claimed in claim 1 comprising a temperature sensor, and the control circuit portion is arranged to observe the comparison signals in response to an output of the temperature sensor indicating that a change in temperature greater than a threshold temperature change has occurred.

11. The integrated circuit as claimed in claim 1, wherein:

the delay circuit portion is further arranged to output one or more additional delayed signals each subject to a respective propagation delay that is dependent on the configurable supply voltage;

for each of said one or more additional delayed signals, the comparison circuit portion is arranged to compare the alternating signal and the respective delayed signal, and output a respective comparison signal if the alternating signal and the respective delayed signals indicate that the respective propagation delay is smaller than the period of the clock signal; and the control circuit portion is further arranged to control the configurable supply voltage in dependence on each respective comparison signal.

12. The integrated circuit as claimed in claim 11, wherein the delay circuit portion comprises a plurality of delay elements connected in series, wherein each of the first, second and additional delayed signals is provided by an output of a respective delay element of the plurality of delay elements.

13. The integrated circuit as claimed in claim 11, wherein the control circuit portion is arranged to generate, based on the comparison signals output by the comparison circuit portion, a difference value indicative of a difference between a current supply voltage and a desired supply voltage, and to control the configurable supply in dependence on said difference value.

14. The integrated circuit as claimed in claim 13, wherein the control circuit portion is arranged to adjust the configurable supply voltage in steps, the size of each step being controlled in dependence on the difference value.

15. The integrated circuit as claimed in claim 1, wherein each delay element comprises a plurality of inverters connected in series.

16. The integrated circuit as claimed in claim 1, wherein the comparison circuit portion comprises a first capture flip-flop which is clocked by the clock signal and arranged to receive the alternating signal at an input thereof, and, for each delayed signal output by the delay circuit portion:

a respective capture flip-flop clocked by the clock signal and arranged to receive the respective delayed signal at an input thereof; and a logic gate arranged to:

receive an output of the first capture flip-flop at a first input thereof;

receive an output of the respective flip-flop at a second input thereof; and output the respective comparison signal.

17. The integrated circuit as claimed in claim 1, wherein the alternating signal changes state once per clock cycle of the clock signal.

18. The integrated circuit as claimed in claim 1 comprising one or more voltage domains each having a respective configurable supply voltage provided by the configurable power supply or by a respective configurable power supply, each voltage domain comprising a respective detection circuit portion arranged to receive and control the respective supply voltage of that voltage domain.

19. An integrated circuit comprising:

an oscillator arranged to output a periodic clock signal;

a logic circuit portion;

a detection circuit portion for detecting signal propagation delay relative to a frequency of said clock signal;

a configurable power supply arranged to provide a configurable supply voltage to the logic circuit portion and to the detection circuit portion;

wherein the detection circuit portion comprises:

a latch circuit portion arranged to output an alternating signal that changes state in dependence on the clock signal;

a delay circuit portion arranged to receive said alternating signal, output a first delayed signal subject to a first propagation delay which is dependent on the configurable supply voltage, and output a second delayed signal subject to a second propagation delay which is dependent on the configurable supply voltage; and a comparison circuit portion arranged to:

compare the alternating signal and the first delayed signal, and output a first comparison signal if the alternating signal and the first delayed signal indicate that the first propagation delay is smaller than a period of the clock signal; and compare the alternating signal and the second delayed signal, and output a second comparison signal if the alternating signal and the second delayed signal indicate that the second propagation delay is smaller than the period of the clock signal; and a control circuit portion arranged to control the configurable supply voltage provided by the configurable power supply in dependence on the first and second comparison signals;

wherein the latch circuit portion comprises a flip-flop which is clocked by the periodic clock signal and an inverter connected between an output of said flip-flop and an input of said flip-flop.

20. A method of controlling a configurable supply voltage provided by a configurable power supply, the method comprising:

receiving a periodic clock signal;

generating an alternating signal that changes state once per clock cycle of the clock signal;

subjecting the alternating signal to a first propagation delay which is dependent on the configurable supply voltage in order to provide a first delayed signal;

subjecting the alternating signal to a second propagation delay which is dependent on the configurable supply voltage in order to provide a second delayed signal;

comparing the alternating signal and the first delayed signal and generating a first comparison signal if the alternating signal and the first delayed signal indicate that the first propagation delay is smaller than the period of the clock signal;

comparing the alternating signal and the second delayed signal and generating a second comparison signal if the alternating signal and the second delayed signal indicate that the second propagation delay is smaller than the period of the clock signal; and controlling the configurable supply voltage provided by the configurable power supply in dependence on the first and second comparison signals;

wherein the delay circuit portion comprises a first delay element and a second delay element connected in series, an output of the first delay element providing the first delayed signal and an output of the second delay element providing the second delayed signal.

* * * * *